US00RE44009E

(19) United States
(12) Reissued Patent
Spengler

(10) Patent Number: US RE44,009 E
(45) Date of Reissued Patent: Feb. 19, 2013

(54) ASSESSING ENERGY REQUIREMENTS FOR A REFRESHED DEVICE

(75) Inventor: David L. Spengler, Colorado Springs, CO (US)

(73) Assignee: Seagate Technology LLC, Cupertino, CA (US)

(21) Appl. No.: 12/691,434

(22) Filed: Jan. 21, 2010

Related U.S. Patent Documents

Reissue of:
(64) Patent No.: 7,321,521
Issued: Jan. 22, 2008
Appl. No.: 10/884,601
Filed: Jul. 2, 2004

(51) Int. Cl.
*G11C 7/00* (2006.01)
*G11C 5/14* (2006.01)
*H02J 7/00* (2006.01)
*G06F 1/30* (2006.01)

(52) U.S. Cl. ..... 365/222; 365/228; 365/229; 320/132; 713/340

(58) Field of Classification Search ..... 365/222, 365/226, 228; 713/340; 320/132
See application file for complete search history.

(56) References Cited

U.S. PATENT DOCUMENTS

| | | | | |
|---|---|---|---|---|
| 3,771,132 | A | | 11/1973 | Biewer |
| 3,784,182 | A | | 1/1974 | Sobel |
| 3,823,388 | A | | 7/1974 | Chadima, Jr. et al. |
| 3,941,989 | A | | 3/1976 | McLaughlin et al. |
| 4,030,086 | A | | 6/1977 | Salem |
| 4,151,454 | A | | 4/1979 | Iida |
| 4,193,026 | A | | 3/1980 | Finger et al. |
| 4,203,103 | A | | 5/1980 | Osada et al. |
| 4,390,841 | A | | 6/1983 | Martin et al. |
| 4,525,055 | A | | 6/1985 | Yokoo |
| 4,701,884 | A | * | 10/1987 | Aoki et al. ..... 365/189.09 |
| 4,907,183 | A | | 3/1990 | Tanaka |
| 5,157,634 | A | | 10/1992 | Dhong et al. |
| 5,216,351 | A | * | 6/1993 | Shimoda ..... 323/224 |
| 5,247,655 | A | | 9/1993 | Khan et al. |
| 5,272,676 | A | * | 12/1993 | Kubono et al. ..... 365/222 |
| 5,284,719 | A | | 2/1994 | Landau et al. |
| 5,353,430 | A | | 10/1994 | Lautzenheiser |
| 5,430,680 | A | | 7/1995 | Parris |
| 5,455,801 | A | | 10/1995 | Blodgett et al. |
| 5,485,429 | A | | 1/1996 | Ono |
| 5,774,404 | A | * | 6/1998 | Eto ..... 365/222 |
| 5,818,762 | A | | 10/1998 | Maari et al. |
| 5,852,582 | A | | 12/1998 | Cleveland et al. |

(Continued)

FOREIGN PATENT DOCUMENTS

| | | | |
|---|---|---|---|
| JP | 52135633 | A2 | 11/1977 |
| WO | WO9015999 | A1 | 12/1990 |

*Primary Examiner* — Ly D Pham
(74) *Attorney, Agent, or Firm* — Crawford Maunu PLLC

(57) ABSTRACT

Method and apparatus for assessing a time interval during which a refresh device can be maintained in a self-refresh mode by an associated energy source. The refresh device is initially operated in a self-refresh mode to maintain the device in a selected state. The time interval during which the refresh device can be subsequently maintained in the refresh mode is next determined in relation to an energy requirement value obtained during the self-refresh mode and an energy capacity value from the associated energy source. The energy capacity value is preferably obtained by fully discharging the associated energy source. Preferably, the refresh device is characterized as a dynamic random access memory (DRAM), and the associated energy source is characterized as a rechargeable backup battery. A selected test pattern is preferably written to the refresh device and maintained thereby during the self-refresh mode.

19 Claims, 4 Drawing Sheets

U.S. PATENT DOCUMENTS 5,898,880 A 4/1999 Ryu
5,986,435 A 11/1999 Koenck et al.
6,043,630 A 3/2000 Koenck et al.
6,051,957 A * 4/2000 Klein ..... 320/132
6,236,869 B1 * 5/2001 Adachi et al. ..... 455/572
6,298,000 B1 * 10/2001 Kitade et al. ..... 365/222
6,307,349 B1 10/2001 Koenck et al.
6,307,394 B1 10/2001 Farnworth et al.
6,317,852 B1 * 11/2001 Lau et al. ..... 714/720
6,377,028 B1 4/2002 Armstrong, II et al.
6,389,505 B1 5/2002 Emma et al.
6,411,157 B1 * 6/2002 Hsu et al. ..... 327/536
6,484,110 B1 * 11/2002 Jung ..... 702/63
6,529,840 B1 3/2003 Hing
6,553,501 B1 4/2003 Yokoe
6,564,073 B1 * 5/2003 Uggmark et al. ..... 455/573
6,590,886 B1 * 7/2003 Easton et al. ..... 370/342
6,611,921 B2 8/2003 Casebolt et al.
6,630,814 B2 10/2003 Ptasinski et al.
6,642,719 B1 11/2003 Seto
6,671,552 B2 12/2003 Merritt et al.
6,704,629 B2 3/2004 Huang
6,737,831 B2 5/2004 Champlin
6,988,218 B2 * 1/2006 Drexler ..... 713/600
2002/0136075 A1 * 9/2002 Chen Hsu et al. ..... 365/222
2004/0062119 A1 * 4/2004 Stimak et al. ..... 365/222
2004/0177210 A1 * 9/2004 Choi ..... 711/5
2004/0196718 A1 * 10/2004 Poechmueller ..... 365/222
2004/0232884 A1 * 11/2004 Vaillancourt et al. ..... 320/132
2005/0122809 A1 * 6/2005 Kim ..... 365/203
2005/0135171 A1 * 6/2005 Kim ..... 365/222
2005/0151543 A1 * 7/2005 Taylor ..... 324/609
2005/0201174 A1 * 9/2005 Klein ..... 365/222
2006/0028893 A1 * 2/2006 Nakashima et al. ..... 365/222

* cited by examiner

ASSESSING ENERGY REQUIREMENTS FOR A REFRESHED DEVICE

Matter enclosed in heavy brackets [ ] appears in the original patent but forms no part of this reissue specification; matter printed in italics indicates the additions made by reissue.

FIELD OF THE INVENTION

The claimed invention relates generally to the field of electrical circuitry and more particularly, but not by way of limitation, to an apparatus and method for assessing energy requirements for a refreshed device, such as dynamic random access memory (DRAM).

BACKGROUND

To operate properly, electrical circuitry often requires a continuous supply of electrical energy. The energy can be provided from a source at one or more nominal voltage levels (e.g., +3.3 volts, v), and current is drawn at these respective voltage levels. The circuitry can operate in a variety of modes each having different associated levels of energy consumption.

A refreshed circuit device includes an operational mode and a refresh mode, with the operational mode relating to its operational interaction with other circuitry and the refresh mode relating to actions taken place to maintain the device in a given state. For example, dynamic random access memory (DRAM) provides an array of storage cells that store electrical charge in order to serve as a memory space for digital data. Data are read from and written to the various cells to carry out a data transfer operation with other circuitry.

Because the storage cells lose the stored charge at a given decay rate (i.e., the storage cells in a DRAM can be characterized as leaky capacitors), a self-refresh operation is carried out in the background in order to maintain the device in the then-existing logical state. During the self-refresh operation, the device reads the state of the array and then rewrites that same state to the various storage cells in the array. In this way, the charge in the various storage cells is continually refreshed at a rate faster than the rate at which charge decays from the cells.

It follows that the state of a refreshed device will generally be lost once the application of electrical power to the device is interrupted. There is therefore a continued need for improvements in the art whereby the standby energy requirements for a refreshed device can be accurately assessed, thereby allowing the refreshed device to be supplied with sufficient backup power from a battery or other standby source to maintain the then-existing state until normal system operation can be restored.

SUMMARY OF THE INVENTION

Preferred embodiments of the present invention are generally directed to a method and an apparatus for assessing a time interval during which a refresh device can be maintained in a self-refresh mode by an associated energy source.

In accordance with some preferred embodiments, the method comprises operating the refresh device in a self-refresh mode to maintain the device in a selected state. The method further comprises determining a time interval during which the device can be subsequently maintained in the refresh mode in relation to an energy requirement value obtained during the operating step and an energy capacity value from the associated energy source.

Preferably, the refresh mode of the operating step comprises assessing a nominal charge level of the device and repetitively supplying additional charge to the device to maintain said nominal charge level. The method further preferably comprises transitioning the device from an operational mode, wherein a charge level of the device is selectively altered by a second device, to the self-refresh mode wherein the device is decoupled from the second device and maintains a selected charge level.

The method further preferably comprises obtaining the energy capacity value from the associated energy source by discharging the associated energy source through a load.

Energy is preferably supplied to the device during the operating step from a first energy source. The associated energy source is preferably characterized as comprising a backup battery which is selectively recharged by the first energy source. The obtaining step further preferably comprises selectively inhibiting the recharging of the backup battery by the first energy source while the backup battery is discharged through the load. The energy requirement value is preferably obtained in relation to a current sense resistor.

Preferably, the refresh device is characterized as a dynamic random access memory (DRAM), and the DRAM is preferably used as a cache memory device temporarily store data transferred between a data storage device and a host device. The operating step further preferably comprises writing a selected test pattern to the DRAM which is maintained by the DRAM during the self-refresh mode.

In accordance with further preferred embodiments, the apparatus comprises a refresh device, an associated energy source and a control block. The control block is adapted to operate the refresh device in a self-refresh mode to maintain the device in a selected state and to obtain an energy requirement value for the device during the self-refresh mode.

The control block proceeds to determine a time interval during which the device can be subsequently maintained in the refresh mode in relation to the energy requirement value and an energy capacity value from the associated energy source.

As before, during the self-refresh mode the refresh device preferably assesses a nominal charge level stored therein and repetitively applies additional charge to maintain said nominal charge level. The control block is further preferably adapted to transition the refresh device from an operational mode wherein a charge level of the refresh device is selectively altered by a second device to the self-refresh mode, so that during the self-refresh mode the refresh device is decoupled from the second device and continuously maintains a selected charge level.

The control block is further preferably adapted to discharge the associated energy source through a load to obtain the energy capacity value. A first energy source is preferably configured to supply energy to the refresh device. The associated energy source preferably comprises a backup battery recharged by the first energy source, and the control block preferably inhibits the recharging operation during the battery discharge operation. A current sense resistor is preferably utilized by the control block to determine the energy requirement value in relation to a voltage drop across the resistor.

As before, the refresh device is preferably characterized as a dynamic random access memory (DRAM), and the DRAM is used as a cache memory to temporarily store data transferred between a data storage device and a host computer. The control block preferably writes a selected test pattern to the DRAM prior to the self-refresh operation.

In this way, actual available standby time intervals can be determined, allowing design and maintenance actions to be taken to achieve desired levels of system availability. Additional factors such as operational temperature and aging of the components can also be taken into account, and failure trends can be detected.

These and various other features and advantages which characterize the claimed invention will become apparent upon reading the following detailed description and upon reviewing the associated drawings.

DETAILED DESCRIPTION

Figure 1:
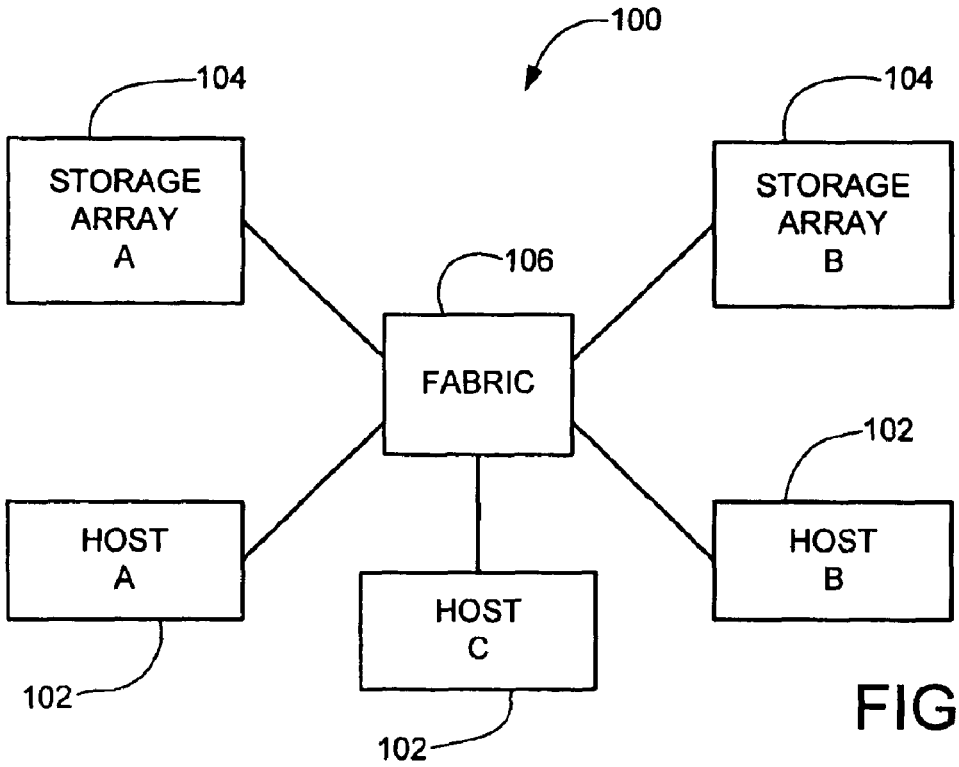
FIG. 1 is a top level functional block depiction of a computer-based system characterized as a wide-area network utilizing mass storage.

To illustrate an exemplary environment in which presently preferred embodiments of the present invention can be advantageously practiced, FIG. 1 shows a computer-based system 100 characterized as a wide area network (WAN) utilizing mass storage.

The system 100 includes a number of host computers 102, respectively identified as hosts A, B and C. The host computers 102 interact with each other as well as with a pair of data storage arrays 104 (denoted A and B, respectively) via a fabric 106. The fabric 106 is preferably characterized as a fibre-channel based switching network, although other configurations can be utilized as well including the Internet.

It is contemplated that the A host computer 102 and the A data storage array 104 are physically located at a first site, the B host computer 102 and B storage array 104 are physically located at a second site, and the C host computer 102 is at yet a third site, although such is merely illustrative and not limiting.

Figure 2:
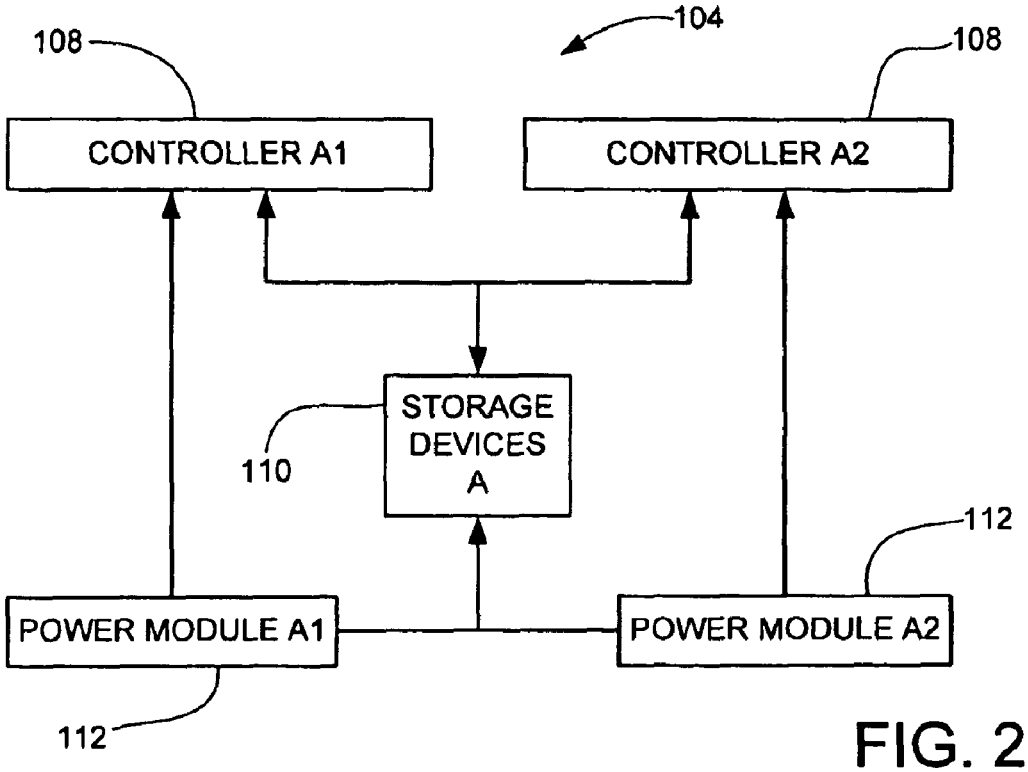
FIG. 2 illustrates the general architecture of a selected one of the data storage arrays of FIG. 1.

As shown in FIG. 2, each array 104 includes a pair of controllers 108 (denoted A1/A2) and a set of data storage devices 110 preferably characterized as hard disc drives operated as a RAID (redundant array of independent discs). The controllers 108 and devices 110 preferably utilize a fault tolerant arrangement so that the various controllers 108 utilize parallel, redundant links and at least some of the user data stored by the system 100 is mirrored on both sets of devices 110.

Each array further includes a pair of power modules 112 (A1/A2) which supply electrical power to the controllers 108 and the storage devices 110. The power modules 112 are preferably configured to operate in tandem so that during normal operation the power module A1 supplies power to the controller A1 and to half of the devices 110, and the power module A2 supplies power to the controller A2 and to the other half of the devices 110. Each power module 112 is further sized and configured to be able to individually supply all of the power for the array 104 should the other power module 112 become inoperative.

Figure 3:
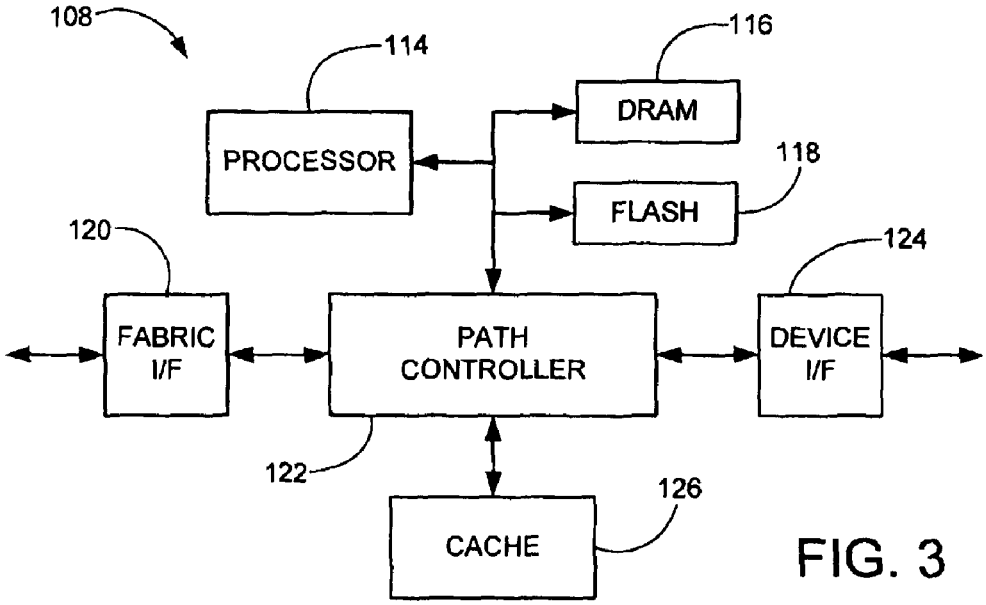
FIG. 3 provides a functional block diagram of a selected one of the controllers of FIG. 2.

FIG. 3 provides a functional diagram of a selected one of the controllers 108 of FIG. 2. A main processor 114 uses programming and data stored in refreshed memory 116 (DRAM) and non-volatile memory (flash) 118 to provide top level control. A communication path is provided by a fabric interface (I/F) block 120, a path controller 122 and a device interface (I/F) block 124.

A refreshed cache memory device 126 provides a memory space for the temporary storage of data being transferred between the host computers 102 and the storage devices 110. For reference, the cache 126 is preferably characterized as one or more DRAM modules having a total selected storage capacity (such as 1.024 gigabytes, GB).

Figure 4:
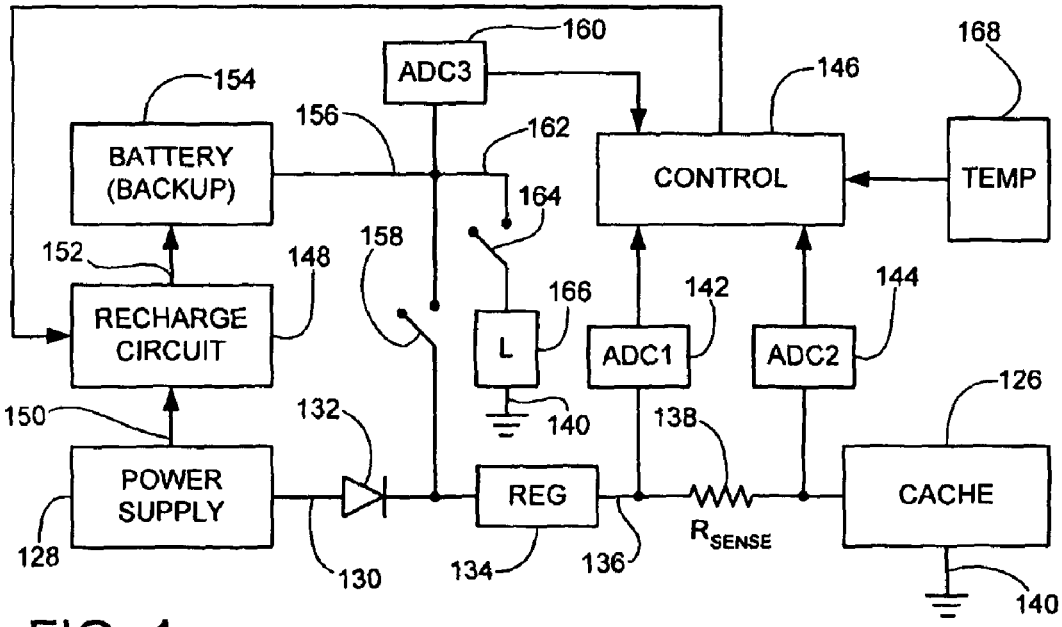
FIG. 4 illustrates relevant portions of one of the power modules of FIG. 2 constructed and operated in accordance with preferred embodiments of the present invention to supply operational and backup power to the cache memory of the controller of FIG. 3.

FIG. 4 shows relevant portions of a selected one of the power modules 112 of FIG. 2. It will be understood that FIG. 4 is generally directed to that portion of the module 112 that provides operational and standby (backup) power to the cache 126.

A power supply 128 operates to receive input AC power from a domestic source (not shown) and output various associated DC voltages on different supply paths, such as the path 130 which is provided at nominally 12V.

This voltage is supplied through protection diode 132 to a regulator 134 which applies voltage regulation to provide an output regulated voltage to path 136. The regulated voltage passes through a current sense resistor ($R_{SENSE}$) 138 and then to the cache 126. Ground connection 140 denotes the completion of this main power supply loop.

A pair of analog to digital converters 142, 144 (denoted as ADC1, ADC2) are arranged on opposing sides of the sense resistor 138 as shown to provide digital indications of the voltage drop across the resistor to a control block 146. The control block 146 can comprise hardware or a software/firmware routine, as desired.

Continuing with the circuitry of FIG. 4, a battery recharge circuit 148 receives input voltage from the power supply via path 150 to selectively apply recharging current to a battery 154 (or other backup power source) via path 152. As discussed below, the battery 154 is configured to supply standby (backup) power to the cache 126 during an anomalous condition (i.e., failure of the power supply 128) to maintain the cache 126 in a continuous self-refresh mode, thereby allowing the cache to save the then-existing contents stored therein until appropriate remedial corrective actions can be taken.

The battery 154 supplies an output voltage (such as on the order of 4-6 volts) on path 156. During normal operation, path 156 is preferably coupled to path 130 (i.e., switching element 158 is closed) so that the regulator receives power from both the power supply 128 and the battery 154. This advantageously assures that should the power supply 128 be interrupted, power will continue to flow to the cache 126. The switching element 158 can comprise a suitable transistor, one or more protection diodes, etc., as desired.

A third analog to digital converter 160 (ADC3) is coupled to the path 156 as shown, and provides a digital representation of the voltage on path 156 to the control block 146. A shunt path 162 also extends from the path 156 to provide a switching element 164 and a load (L) 166. Finally, FIG. 4 shows a temperature sensor (TEMP) 168 located in a suitable location to obtain ambient operational temperature readings and provide digital representations thereof to the control block 146.

Preferred operation of the circuitry of FIG. 4 will now be discussed with respect to FIG. 5, which provides a flow chart for a BACKUP TIME DETERMINATION routine 200. The routine 200 is preferably carried out at appropriate times during the operational life of the system 100 in order to assess the then-existing standby power requirements of the cache 126. This allows appropriate remedial actions to be taken as required to effectively maintain system availability at the requisite levels.

At step 202, the circuitry of FIG. 4 first operates to determine the then-existing energy capacity of the battery 154. This preferably takes place by performing a full discharge of the battery 154 through the load 166. It will be recognized that during this discharge operation, the battery 154 will generally not be available to supply standby power to the cache 126; however, as discussed above the preferred configuration of each storage array 104 provides redundant power modules 112. Step 202 thus further preferably comprises affirmatively arranging the battery backup capability of the other module 112 to cover for the cache 126 if such operation is not already an automatic feature of the system 100.

During the discharge operation, the battery recharging operation from circuit 148 is temporarily suspended, the connection between path 156 and path 130 is broken (e.g., normally closed switching element 158 is opened), connection is made with the load 166 (e.g., normally open switching element 164 is closed), and the ADC3 160 is configured to monitor the voltage from path 156.

Figure 6:
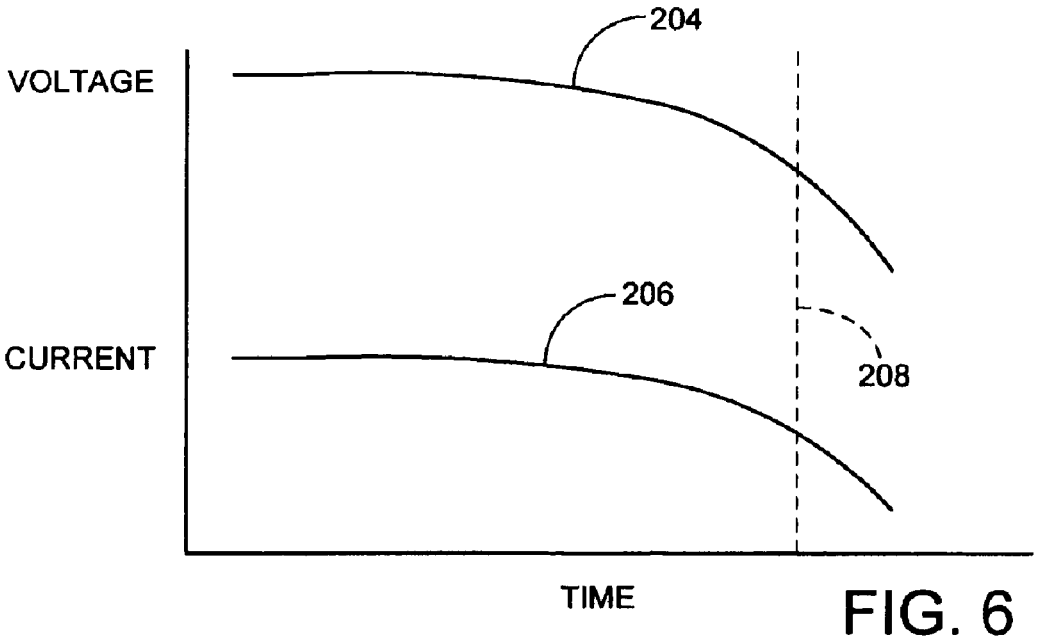
FIG. 6 provides voltage and current decay curves obtained during discharge of the battery of FIG. 4.

The time required for a full and complete discharge of energy from the battery 154 will depend on a number of factors, including the construction of the battery and the size of the load, but generally it is contemplated that this discharge operation will take a number of hours. Since the nominal impedance of the load 166 is known, the readings from the ADC3 160 enable the control block 146 to generate voltage and current decay curves to show the characteristic decay in these levels during the energy discharge operation. Representative voltage and current decay curves are depicted at 204 and 206 in FIG. 6.

As will be recognized, electrical power P can be expressed as a combination of voltage V and current I (i.e., P=V*I, such as watts). Electrical energy can be expressed as power applied during a given time period, t (i.e., E=P*t, such as watt-hours). Accordingly, the respective areas under the curves 204, 206 represent the total energy capacity of the battery 154.

It will be noted that the full discharge of the battery 154 of step 202 provides other benefits as well. Depending on the battery construction, the operational life of the rechargeable battery 154 can be advantageously extended by the periodic full discharge of accumulated charge.

Also, the cache 126 will likely have a minimum voltage input level requirement in order to be able to successfully carry out the refresh operation (e.g., a minimum input voltage of 2.3v). In such case, the energy available from the battery 154 at voltages below this value (i.e., to the right of broken line 208 in FIG. 6) may be insufficient to enable the cache 126 to continue self-refresh operation. The data obtained during step 202 thus further provides valuable information with regard to the tapering characteristics of the battery output, and allows an accurate assessment of the actual energy available to provide standby power to the cache 112 (i.e., those portions of the curves 204, 206 to the left of line 208).

At the conclusion of step 202, the load 166 is disconnected from the battery 154 and the recharge circuit 148 is activated to begin recharging the battery 154 to prepare the circuit for resumption of normal operational mode.

Figure 5:
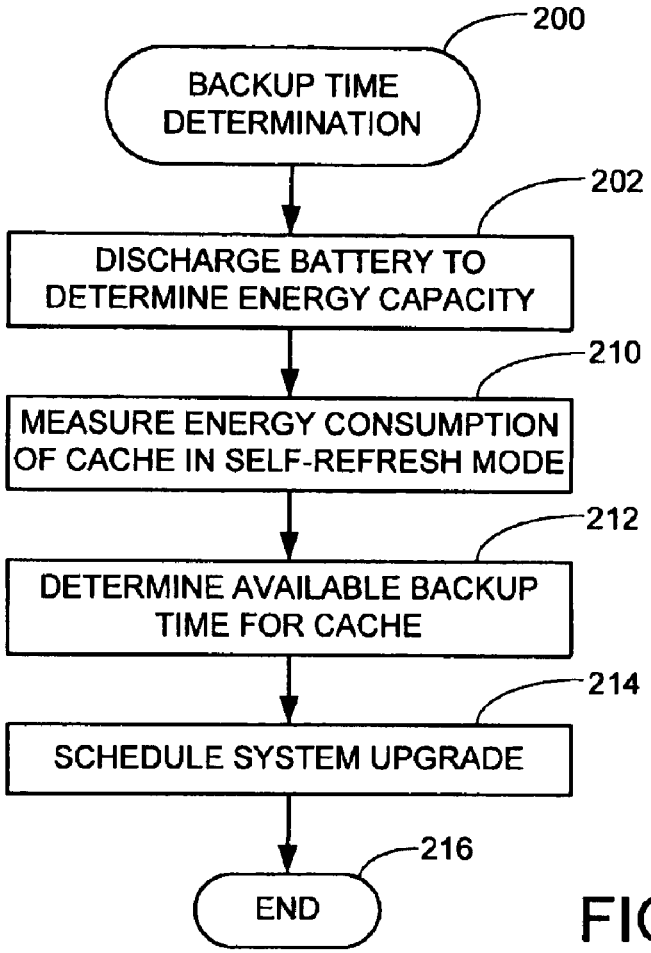
FIG. 5 is a flow chart for a BACKUP TIME DETERMINATION routine illustrative of preferred steps carried out by the circuitry of FIG. 4.

At step 210 in FIG. 5, the circuit 112 next operates to measure the energy consumption of the cache 126 while the cache is maintained in a self-refresh mode. Since the routine 200 is preferably carried out in the background during normal operation, this step will preferably include a temporary decoupling of the cache 126 from other circuitry in the system, such as the path controller 122. This temporarily suspends data transfer operations to read and write data from and to the cache 126.

Instead, the cache 126 operates solely in self-refresh mode to continuously update and maintain the charge in the various storage cells therein to reflect the then-existing state of the memory. To capture an accurate determination of the self-refresh energy consumption of the cache 126, step 210 is initiated while a representative amount of data are stored in the cache 126, such as write-back data pending a write operation to the various devices 110.

As desired, step 210 can include a step of affirmatively writing a selected test pattern to the cache 126 to provide a baseline condition. An advantage of this approach is that the same total amount of charge is stored in the cache 126 during each pass through the routine 200, so that variations observed during each subsequent pass can be attributed to factors other than variations in the amount of refresh charge. In some preferred embodiments, the test pattern comprises a worst case scenario wherein a relatively large number of the storage cells are provided with a logical 1, thereby placing the total charging requirements of the self-refresh operation at a relatively high level.

Once the cache 126 is in self-refresh mode, the voltage and current requirements of the cache 126 are obtained from the outputs of ADC1 142 and ADC2 144. Preferably, multiple measurements are obtained over a selected period of time and averaged or otherwise analyzed to provide an energy consumption value for the cache 126. At the conclusion of this step, the cache 126 is returned to service and updated as required from the cache in the other, associated controller 108.

Continuing with the flow of FIG. 5, the control block 146 next determines at step 212 the available backup time for the cache 126 (i.e., the time interval) based on the energy capacity value of step 202 and the energy consumption value of step 210. As desired, this resulting value can be compared to a threshold value, such as a minimum number of hours (such as T=96 hours). When insufficient backup time is identified, appropriate system upgrades or other corrective actions can be taken, such as denoted by step 214, such as replacement of the battery 154, the cache 126, etc. The routine then ends at step 216.

The routine of FIG. 5 enables a system administrator or other personnel the ability to more accurately assess actual backup capabilities of the circuit of FIG. 4, and to detect failure trends over time. The routine of FIG. 5 further guides the system designer in selecting appropriate components during the initial design phase (or during subsequent system modifications).

By way of illustration, assume the cache 126 is provided from the manufacturer with a specified rating of 36 milliamps (mA) and an input voltage of 2.3v to 2.7v for self-refresh mode operation. This provides an initial maximum corner case power requirement of 97.2 milliwatts, mW (36 mA*2.7v). Using a minimum backup time interval T=96 hours, a total of 9331.2 milliwatt-hours, mWh will be required to satisfy this corner case.

If however the routine 200 shows that the particular cache 126 in FIG. 4 requires only 29.5 mA and 2.53v in self-refresh mode, then the same T interval of 96 hours will only require 7164.96 mWh, thus providing a reduction of over 200 mWh in energy consumption over that specified. This reduction can translate into a longer time interval for a given battery, or enable the battery capacity design to be derated. Thus, the routine 200 allows design and maintenance decisions to be made based on the actual performance of the components, which can lead to decreased system costs and increased system availability.

Figure 7:
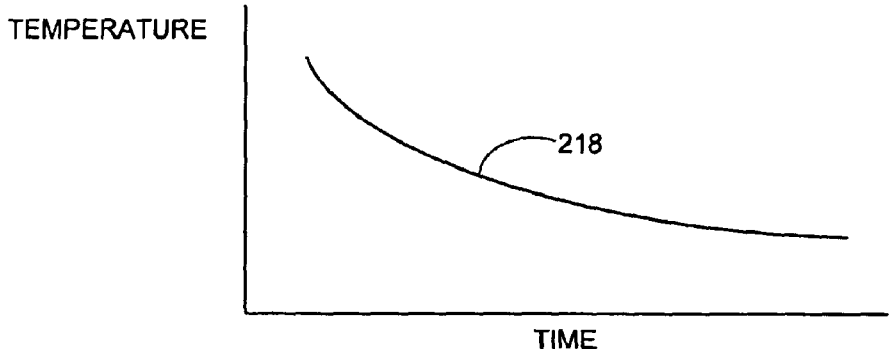
FIG. 7 generally illustrates the relationship between available backup time and operational temperature of the system.

Another advantage associated with the routine of FIG. 5 relates to the adaptive ability to compensate for variations due to other system factors, such as temperature and chronological age of the components. For example, as depicted by backup time curve 218 in FIG. 7, it has been found that energy consumption generally increases, and hence available standby energy time generally decreases, with increases in operational temperature. Correlating the results of the routine 200 of FIG. 5 with temperature (such as from TEMP sensor 168) allows better system availability assessments to be rendered for a given temperature. This also allows a given backup time at a selected temperature to be used to determine the associated backup time for another temperature.

Figure 8:
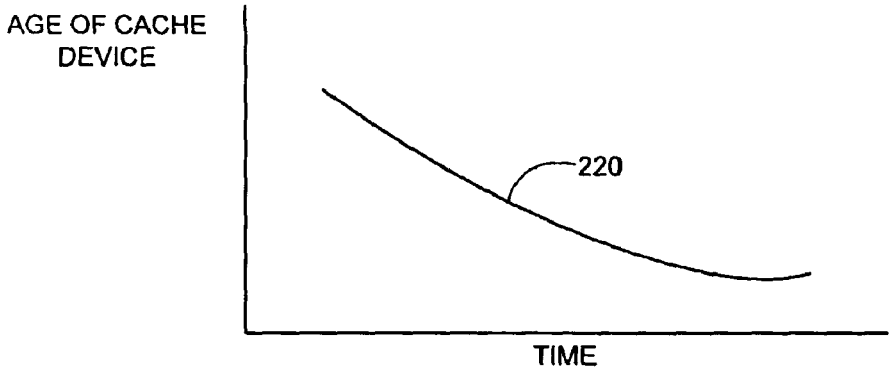
FIG. 8 generally illustrates the relationship between available backup time and age of the cache device.

Similarly, components tend to degrade over time as depicted by backup time curve 220 in FIG. 8, which generally represents an increase in energy consumption by the cache 126 as the cache ages. For a given static energy capacity for the battery 154, curve 220 shows that available standby time can decrease over the life of the cache 126.

Failure trends can accordingly be identified through repetitive operation of the routine 200 over time. The voltage and current decay curves 204, 206 from successive passes of step 202 can be monitored and, when a certain reduction (delta) is observed, battery replacement can be scheduled and performed prior to battery failure. Similarly, the energy consumption rates of the cache 126 can be compared for successive passes of step 210 to detect early failure trends for the cache 126, leading to scheduled replacement thereof at a convenient servicing time.

Figure 9:
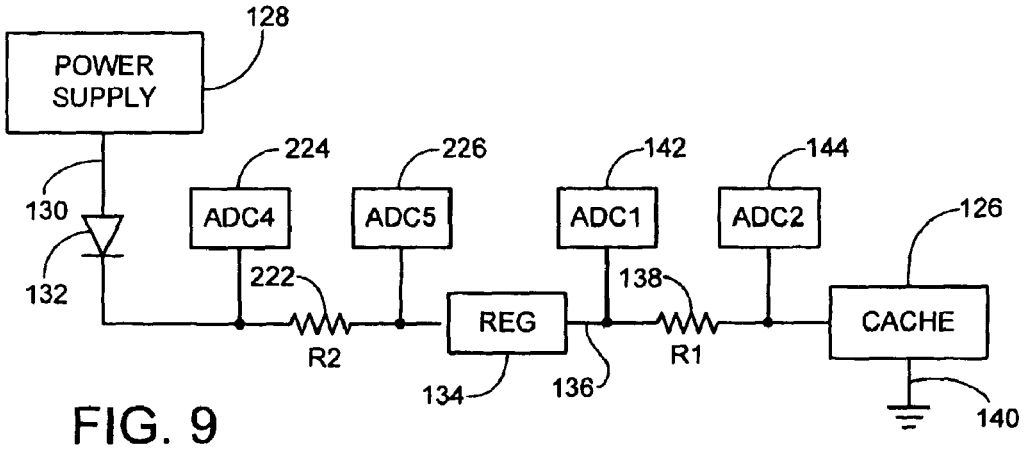
FIG. 9 generally illustrates relevant portions of the circuitry of FIG. 4 in accordance with another preferred embodiment of the present invention.

FIG. 9 provides another preferred embodiment of the present invention wherein the operation of the voltage regulator 134 is additionally monitored during the routine 200. FIG. 9 shows relevant portions of the circuitry of FIG. 4 with the inclusion of a second sense resistor (R2) 222 and two additional analog to digital converters 224, 226 (denoted AGC4 and AGC5) upstream of the regulator 134. Although not shown in FIG. 9, it will be understood that the AGC4 224 and AGC5 226 provide digital inputs to the control block 146 as before.

These additional components enable voltage and current values to be obtained at the input to the regulator 134 (via path 130). The first sense resistor (R1) 138 and the AGC1 and AGC2 142, 144 concurrently obtain voltage and current values at the output of the regulator 134 (via path 136), enabling an efficiency of the regulator 134 to be determined during at least a portion of the self-refresh operation of step 210. Such efficiency can be determined, for example, in relation to the ratio of the power out to the power in ($P_{OUT}/P_{IN}$).

In this way, the regulator 134 can likewise be monitored over time and appropriate corrective actions can be taken as required once a failure trend is detected. The second sense resistor 222, AGC4 224 and AGC5 226 can be utilized at all times during the operation of the circuit of FIG. 9, or can be selectively switched during at least a portion of the self-refresh operation of step 210.

The routine 200 is preferably configured to be performed automatically on an ongoing basis, as well as manually carried out by system administrator personnel at appropriate times as accessed through one of the host computers 102. The resulting data, including actual measurements, curves and trends can likewise be reported via the host computers.

While preferred embodiments have been directed to the use of DRAM as the associated refresh device, such is merely illustrative and not limiting; rather, the foregoing embodiments can be readily adapted for use with any number of different types of devices that employ a charge refresh operation such as capacitive or inductive arrays; plasma, LCD or other types of displays, etc.

It will now be appreciated that preferred embodiments of the present invention are generally directed to a method and apparatus for assessing a time interval during which a refresh device (such as 126) can be maintained in a self-refresh mode by an associated energy source (such as 154).

In accordance with some preferred embodiments, the method comprises operating the refresh device in a self-refresh mode to maintain the device in a selected state (such as step 210). The method further comprises determining a time interval during which the device can be subsequently maintained in said refresh mode in relation to an energy requirement value obtained during the operating step and an energy capacity value from the associated energy source (such as by step 212).

Preferably, the refresh mode of the operating step comprises assessing a nominal charge level of the device and repetitively supplying additional charge to the device to maintain said nominal charge level. The method further preferably comprises transitioning the device from an operational mode wherein a charge level of the device is selectively altered by a second device (such as 122) to said self-refresh mode wherein the device is decoupled from the second device and maintains a selected charge level.

The method further preferably comprises obtaining the energy capacity value from the associated energy source (such as by step 202) by discharging the associated energy source through a load (such as 166).

Energy is preferably supplied to the device during the operating step from a first energy source (such as 128). The associated energy source is preferably characterized as comprising a backup battery which is selectively recharged by the first energy source (such as by 148). The obtaining step further preferably comprises selectively inhibiting the recharging of the backup battery by the first energy source while the backup battery is discharged through the load. The energy requirement value is preferably obtained in relation to a current sense resistor (such as 138).

Preferably, the refresh device is characterized as a dynamic random access memory (DRAM), and the DRAM is preferably used as a cache memory device to temporarily store data transferred between a data storage device (such as 110) and a host device (such as 102). The operating step further preferably comprises writing a selected test pattern to the DRAM which is maintained by the DRAM during the self-refresh mode.

In accordance with further preferred embodiments, the apparatus comprises a refresh device (such as 126), an associated energy source (such as 154) and a control block (such as 146). The control block is adapted to operate the refresh device in a self-refresh mode to maintain the device in a selected state and to obtain an energy requirement value for the device during the self-refresh mode (such as by step 210).

The control block proceeds to determine a time interval during which the device can be subsequently maintained in the refresh mode in relation to the energy requirement value and an energy capacity value from the associated energy source (such as by step 212).

As before, during the self-refresh mode the refresh device preferably assesses a nominal charge level stored therein and repetitively applies additional charge to maintain said nominal charge level. The control block is further preferably adapted to transition the refresh device from an operational mode wherein a charge level of the refresh device is selectively altered by a second device (such as 122) to the self-refresh mode, so that during the self-refresh mode the refresh device is decoupled from the second device and continuously maintains a selected charge level.

The control block is further preferably adapted to discharge the associated energy source through a load (such as 166) to obtain the energy capacity value (such as by step 202). A first energy source (such as 128) is preferably configured to supply energy to the refresh device. The associated energy source preferably comprises a backup battery recharged by the first energy source, and the control block preferably inhibits the recharging operation during the battery discharge operation. A current sense resistor (such as 138) is preferably utilized by the control block 146 to determine the energy requirement value in relation to a voltage drop across the resistor.

As before, the refresh device is preferably characterized as a dynamic random access memory (DRAM), and the DRAM is used as a cache memory to temporarily store data transferred between a data storage device (such as 110) and a host computer (such as 102). The control block preferably writes a selected test pattern to the DRAM prior to the self-refresh operation.

For purposes of the appended claims, the recited "first means" will be understood to correspond to the disclosed control block 146 of FIG. 4 which operates in accordance with the flow of FIG. 5. The term refresh will be defined consistent with the foregoing discussion to require the addition of electrical charge to maintain a level of charge at or in a selected relation to a desired charge level.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular processing environment without departing from the spirit and scope of the present invention.

In addition, although the embodiments described herein are directed to a data storage array, it will be appreciated by those skilled in the art that the claimed subject matter is not so limited and various other processing systems can be utilized without departing from the spirit and scope of the claimed invention.

What is claimed is:

1. A method comprising a step of determining a time interval over which a refresh device is subsequently maintainable in a self-refresh mode by an associated energy source, said interval comprising multiple charge decay and refresh cycles for the device, wherein the time interval of the determining step is determined *by use of a timing circuit* in relation to an energy requirement value of the device obtained during device operation and an energy capacity value of the energy source.

2. The method of claim 1, wherein the determining step comprises assessing a nominal charge level of the device and repetitively supplying additional charge to the device to maintain said nominal charge level.

3. [The] *A* method [of claim 1] *comprising a step of determining a time interval over which a refresh device is subsequently maintainable in a self-refresh mode by an associated energy source, said interval comprising multiple charge decay and refresh cycles for the device, wherein the time interval of the determining step is determined in relation to an energy requirement value of the device obtained during device operation and an energy capacity value of the energy source*, wherein the energy capacity value is obtained by discharging the energy source through a separate load.

4. The method of claim 1, wherein the associated energy source is characterized as comprising a backup battery and wherein the time interval begins with device operation and ends when the battery reaches a depleted condition no longer capable of supplying sufficient charge to the device to continue said refresh operation.

5. The method of claim 1, wherein the energy requirement value is obtained in relation to a current sense resistor coupled to the device.

6. The method of claim 1, wherein the determining step further comprises further deriving the time interval in relation to a previous energy requirement value obtained during a previous operation of the device.

7. The method of claim 1, wherein the device is characterized as comprising a dynamic random access memory (DRAM).

8. [The] *A* method [of claim 6, wherein] *comprising a step of determining a time interval over which a refresh device is subsequently maintainable in a self-refresh mode by an associated energy source, said interval comprising multiple charge decay and refresh cycles for the device, wherein the time interval of the determining step is determined in relation to an energy requirement value of the device obtained during device operation and an energy capacity value of the energy source, wherein the determining step further comprises further deriving the time interval in relation to a previous energy requirement value obtained during a previous operation of the device,* the operating step further comprises writing a selected test pattern to [the] DRAM, wherein the DRAM maintains said test pattern during said refresh mode.

9. An apparatus configured to carry out [the] *a* method [of claim 1] *comprising a step of determining a time interval over which a refresh device is subsequently maintainable in a self-refresh mode by an associated energy source, said interval comprising multiple charge decay and refresh cycles for the device, wherein the time interval of the determining step is determined using a timing circuit in relation to an energy requirement value of the device obtained during device operation and an energy capacity value of the energy source*.

10. An apparatus comprising a refresh device, an associated energy source and a control block adapted to determine a maximum interval over which the refresh device is subsequently maintainable in a self-refresh mode by the energy source, said interval beginning with device operation and ending when the refresh device can no longer supply sufficient charge to continue said self-refresh mode, the apparatus further comprising a current sense resistor coupled to the refresh device, wherein the control block determines an energy requirement value in relation to a voltage drop across said resistor and determines said interval in relation to the energy requirement value.

11. The apparatus of claim 10, wherein during the self-refresh mode the refresh device assesses a nominal charge level stored therein and repetitively applies additional charge to maintain said nominal charge level.

12. The apparatus of claim 10, wherein the control block is further adapted to transition the refresh device from an operational mode wherein a charge level of the refresh device is selectively altered by a second device to said self-refresh mode, wherein during said self-refresh mode the refresh device is decoupled from the second device and continuously maintains a selected charge level.

13. The apparatus of claim 10, wherein the control block is further adapted to discharge the associated energy source through a load to obtain an energy capacity value used to determine said interval.

14. The apparatus of claim 13, further comprising a first energy source configured to supply energy to the refresh device, wherein the associated energy source is characterized as comprising a backup battery which is selectively recharged by the first energy source, and wherein the control block further inhibits said recharging of the backup battery by the first energy source while the backup battery is discharged through said load.

15. The apparatus of claim 10, wherein the refresh device is characterized as comprising a cache memory device used to temporarily store data transferred between a data storage device and a host device.

16. The apparatus of claim 10, further comprising a voltage regulator which regulates input energy supplied to the refresh device during the self-refresh mode, wherein the control block further determines an efficiency of the voltage regulator during said self-refresh mode.

17. The apparatus of claim 15, wherein the control block is further adapted to write a selected test pattern to the cache memory device prior to operation of the cache memory device in the self-refresh mode so that the cache memory device refreshes the selected test pattern during the self-refresh mode.

*18. A method comprising: determining, by use of a circuit including programmable computer circuit, a time interval over which a refresh device is subsequently maintainable in a mode permissive of a self-refresh operation by an associated energy source, the time interval including multiple charge cycles for the device, wherein the programmable computer circuit determines the time interval in relation to an energy requirement value of the device obtained during device operation and an energy capacity value of the energy source.*

*19. For use in a system including a memory device, a method comprising:*

*providing power-related degradation data associated with the memory device;*

*based on the power-related degradation data and threshold criteria applicable to at least part of the memory device, using a computing circuit during the operational life of the memory device to execute an algorithm for assessing integrity of the memory device and, in response thereto, generating data for scheduling maintenance of the system.*

* * * * *

UNITED STATES PATENT AND TRADEMARK OFFICE

CERTIFICATE OF CORRECTION

PATENT NO. : RE44,009 E
APPLICATION NO. : 12/691434
DATED : February 19, 2013
INVENTOR(S) : Spengler It is certified that error appears in the above-identified patent and that said Letters Patent is hereby corrected as shown below:

In the Specification

Col. 2, line 26: "memory device temporarily" should read --memory device *to* temporarily--.

Signed and Sealed this
Twenty-fifth Day of March, 2014

Michelle K. Lee

Michelle K. Lee
*Deputy Director of the United States Patent and Trademark Office*